United States Patent
Au et al.

(10) Patent No.: US 9,558,859 B2
(45) Date of Patent: Jan. 31, 2017

(54) MULTILAYER SUBSTRATE AND METHOD FOR MANUFACTURING THE SAME

(71) Applicant: RSM Electron Power, Inc., Deer Park, NY (US)

(72) Inventors: Ching Au, Port Washington, NY (US); Manhong Zhao, New Hyde Park, NY (US); Robert Conte, West Babylon, NY (US)

(73) Assignee: RSM ELECTRON POWER, INC., Deer Park, NY (US)

( * ) Notice: Subject to any disclaimer, the term of this patent is extended or adjusted under 35 U.S.C. 154(b) by 0 days.

(21) Appl. No.: 14/183,492

(22) Filed: Feb. 18, 2014

(65) Prior Publication Data

US 2015/0237724 A1    Aug. 20, 2015

(51) Int. Cl.
| | | |
|---|---|---|
| *H01B 1/02* | (2006.01) | |
| *H05K 3/24* | (2006.01) | |
| *H01L 23/373* | (2006.01) | |

(52) U.S. Cl.
CPC ............. *H01B 1/02* (2013.01); *H01L 23/3735* (2013.01); *H01L 23/3736* (2013.01); *H05K 3/244* (2013.01); *H01L 2924/0002* (2013.01); *H05K 2201/0341* (2013.01); *H05K 2201/068* (2013.01); *Y10T 428/1275* (2015.01); *Y10T 428/1291* (2015.01); *Y10T 428/12743* (2015.01); *Y10T 428/12847* (2015.01); *Y10T 428/12889* (2015.01); *Y10T 428/12896* (2015.01)

(58) Field of Classification Search
CPC ........ H01L 24/12; H01L 24/81; H01L 27/016; H01L 23/3735; H01L 23/3736; H05K 1/03; H05K 3/244; H01B 13/00; H01B 13/0026

See application file for complete search history.

(56) References Cited

U.S. PATENT DOCUMENTS

| | | | | |
|---|---|---|---|---|
| 4,075,416 | A * | 2/1978 | Kuttner et al. ............... | 174/257 |
| 8,810,966 | B1 * | 8/2014 | Zhong ..................... | G11B 5/50 |
| | | | | 360/234.5 |
| 2001/0019882 | A1 * | 9/2001 | Jiang ............................ | 438/584 |
| 2003/0010975 | A1 * | 1/2003 | Gibb et al. ..................... | 257/40 |
| 2009/0261472 | A1 * | 10/2009 | Bayerer ........................ | 257/719 |
| 2011/0206912 | A1 * | 8/2011 | Au et al. ....................... | 428/209 |
| 2011/0227089 | A1 * | 9/2011 | Mieczkowski et al. ........ | 257/76 |
| 2012/0181071 | A1 * | 7/2012 | Jadhav .................... | H01L 24/11 |
| | | | | 174/257 |
| 2012/0306080 | A1 * | 12/2012 | Yu et al. ....................... | 257/751 |
| 2013/0134433 | A1 * | 5/2013 | Ward ................... | H01L 23/4827 |
| | | | | 257/76 |
| 2014/0070226 | A1 * | 3/2014 | Alvarez et al. ................ | 257/76 |

* cited by examiner

*Primary Examiner* — Fazli Erdem
(74) *Attorney, Agent, or Firm* — Raymond Y. Chan; David and Raymond Patent Firm

(57) ABSTRACT

The invention provides a slip layer substrate which can reduce the thermal residual stresses between components induced by their mismatch of thermal expansion, thus greatly improve the reliability of electronic packages. The slip layer substrate comprises: a base material; a first metallization layer formed on the base material; a first diffusion barrier layer formed on the first metallization layer; a slip layer formed on the first diffusion barrier layer; a second diffusion barrier layer formed on the slip layer; and a second metallization layer formed on the second diffusion barrier layer.

18 Claims, 3 Drawing Sheets

MULTILAYER SUBSTRATE AND METHOD FOR MANUFACTURING THE SAME

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

This invention relates to a substrate structure, and more particularly, to a multilayer substrate which reduces the residual stress induced by thermal expansion mismatch in electronic packages.

Description of Related Arts

Multilayer metallized substrates have been extensively used in electronic packages, such as DBC (direct bonded copper) substrate, AMB (active metal braze), DPC (direct plated copper), thick film plated up technology, and thin film technology. As an example, shown in FIG. 1, a typical DBC substrate consists of a ceramic base material 10 and copper metallization 11 on one side or on both sides. The copper metallization 11 is plated with a nickel plating layer 12, and a gold plating layer 13. Commonly used base materials are ceramics such as AlN, Al2O3, BeO, and Si3N4. The ceramic provides mechanical strength and electrical insulation from a live circuit to chassis, while the copper metallization provides interconnections to form an electrical circuit. The nickel plating layer 12, which separates the copper metallization 11, is formed on top of the copper metallization 11. The gold plating layer 13 is formed on top of the nickel plating layer 12. The nickel plating layer 12 between the copper metallization 11 and the gold plating layer 13 serves as a diffusion barrier which prevents the diffusion between the copper metallization 11 and the gold plating layer 13. On top of the gold plating 13, electronic devices, such as diodes and IGBTs, are attached by solder or conductive epoxy. The gold plating layer 13 prevents oxidation and improves solderability and bondability for die attachment. The combination of all layers makes the electrically insulated substrate strong in mechanical strength, and forms an electrical circuitry when electronic devices are bonded onto the metallization. The substrate is then attached by solder, epoxy, or thermal grease to a metal heat spreader such as copper or aluminum, for heat spreading and dissipating.

A common issue of the abovementioned structure where a multilayer metallized substrate with electronic devices populated is attached onto a metal heat spreader is the excessive residual stress caused by thermal expansion mismatch between the internal layers. The excessive residual stress plays a major role in the long-term reliability of electronic packages which are characterized as multilayered structures. Among the materials of the layers in a multilayer metallized substrate that is attached to a metal heat spreader, the coefficient of thermal expansion (CTE) of silicon is 2.5 ppm/° C., CTE of ceramic materials is normally between 3 ppm/° C. and 10 ppm/° C., CTE of copper is 17 ppm/° C., CTE of nickel is 13 ppm/° C., CTE of gold is 14 ppm/° C., and CTE of solder materials is generally between 13 ppm/° C. to 35 ppm/° C. When temperature changes, the materials of all layers of this multilayer structure expand or contract at different rates because the materials have different CTE's. Temperature range of applications in automobile, military, and aerospace usually falls between −55° C. and 150° C. In some extreme cases, the application temperature can get as low as −65° C. and as high as 200° C. Exposure to such a wide temperature range can result in excessive thermal residual stress as high as several hundred mega Pascal in the multilayered structure, which can induce solder interface cohesive failure, copper/ceramic interface fracture, ceramic cohesive fracture, copper/solder adhesive failure, and even cracking of silicon electronic components. As a result of these failures, the actual contact area between layers of the substrate is reduced, so that the electronic devices that are bonded onto the substrate will run hotter due to a more restricted path of conduction, indirectly reducing the life of the product (or a lower MTBF number). In some severe cases, the assembly can simply malfunction due to the cracking of the ceramic substrate, compromising the integrity of the circuitry that forms on top of the substrate, or due to die cracking as a direct result of substrate cracking.

Several approaches have been utilized to address this long term reliability issue induced by mismatch of thermal expansion. One approach is to use heat spreader materials with similar thermal expansion coefficient as that of ceramics and electronic components. For example, AlSiC and CE alloy have a CTE of less than 10 ppm/° C. The major drawbacks of these materials are the high material cost, and long lead time, which prevent their widespread use in electronic packaging industry, unless very large volume is used for a single design. In addition, AlSiC is a brittle material that is difficult to machine without running into the risk of cracking it, requiring a custom design to incorporate aluminum rich area for each mounting hole so that it can be drilled without cracking.

It is desirable, therefore, to provide a multilayer substrate which reduces the residual stress induced by thermal expansion mismatch in electronic packages.

SUMMARY OF THE PRESENT INVENTION

One objective of the present invention is to provide a slip layer substrate which can absorb/relieve the excessive stress caused by the mismatch of thermal expansion, thus greatly improving the reliability of electronic packages.

To achieve the abovementioned objective, the invention provides a slip layer substrate, comprising: a base material; a first metallization layer formed on the base material; a first diffusion barrier layer formed on the first metallization layer; a malleable layer, so called slip layer, formed on the first diffusion barrier layer; a second diffusion barrier layer formed on the slip layer; and a second metallization layer formed on the second diffusion barrier layer.

According to the slip layer substrate aforementioned, wherein the base material can be ceramic, metal based material, or non-metal based material.

According to the slip layer substrate aforementioned, wherein the material of the first metallization layer is copper, aluminum, or any conductive pure metal or conductive alloy that can establish electrical connection purpose.

According to the slip layer substrate aforementioned, wherein the material of the first diffusion barrier layer and the second diffusion barrier layer is nickel, chromium, or cobalt.

According to the slip layer substrate aforementioned, wherein the first diffusion barrier layer is formed on the first metallization layer; the second diffusion barrier layer is formed on the slip layer; the slip layer is formed on the first diffusion barrier layer; and the second metallization layer is form on the second diffusion barrier layer.

According to the slip layer substrate aforementioned, wherein the slip layer is made of malleable and ductile materials, such as pure metals like gold, silver, aluminum or copper etc. and some malleable metal alloys and non-metals.

According to the slip layer substrate aforementioned, wherein the material of the second metallization layer is gold, silver, aluminum or copper.

Another embodiment of the invention provides a method for manufacturing slip layer substrate, comprising: providing a base material; forming a first metallization layer on the base material; forming a first diffusion barrier layer on the first metallization layer; forming a slip layer on the first diffusion barrier layer; forming a second diffusion barrier layer on the slip layer; and forming a second metallization layer on the second diffusion barrier layer.

According to the method for manufacturing slip layer substrate aforementioned, wherein the base material is ceramic, metal based material, or non-metal based material.

According to the method for manufacturing slip layer substrate aforementioned, wherein the material of the first metallization layer is copper, aluminum, or any conductive pure metal or conductive alloy that can establish electrical connection purpose.

According to the method for manufacturing slip layer substrate aforementioned, wherein the material of the first diffusion barrier layer and the second diffusion barrier layer is nickel, chromium, or cobalt.

According to the method for manufacturing slip layer substrate aforementioned, wherein the first diffusion barrier layer is formed on the first metallization layer; the second diffusion barrier layer is formed on the slip layer; the slip layer is formed on the first diffusion barrier layer; and the second metallization layer is formed on the second diffusion barrier layer.

According to the method for manufacturing slip layer substrate aforementioned, wherein the slip layer is made of malleable and ductile materials, such as pure metals like gold, silver, aluminum or copper etc. and some malleable metal alloys and non-metals.

According to the method for manufacturing slip layer substrate aforementioned, wherein the material of the second metallization layer is gold, silver, aluminum or copper.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

The details and technology of the present invention are described below with reference to the accompanying drawings.

BRIEF DESCRIPTION OF THE DRAWINGS

The objectives, spirits, and advantages of the preferred embodiments of the present invention will be readily understood by the accompanying drawings and detailed descriptions, wherein.

DETAILED DESCRIPTION OF THE PREFERRED EMBODIMENT

For clarity of disclosure, and not by way of limitation, the detailed description of the invention is divided into the subsections that follow.

Figure 1:
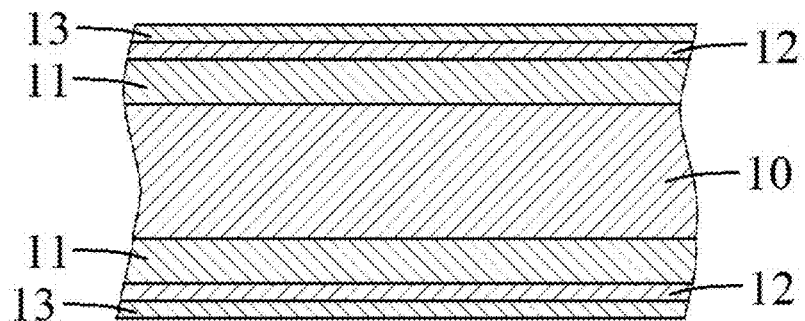
FIG. 1 is a schematic cross-section view of the multilayer metallized substrate.
Figure 2:
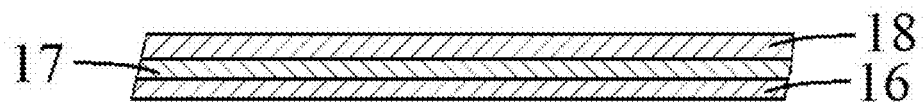
FIG. 2 is a schematic cross-section view of partial layers of the slip layer substrate of the present invention.

With reference to FIG. 2, this illustrates a schematic cross-section view of partial layers of the slip layer substrate of the present invention. A slip layer 17 is made of malleable and ductile materials, such as pure metals like gold, silver, aluminum or copper etc. and some malleable metal alloys and non-metals. Malleability is the property of a material where it can deform under compressive stress, while ductility refers to a material's ability to deform under tensile stress. For example, gold is the most malleable metal, and it can be beaten into extremely thin sheets. A gram of gold can be worked into a leaf covering 0.6 square meter, or into a wire 2.5 kilo meter in length. Both malleability and ductility are relative terms. In the circumstance of electronics packaging, material that sustains no less than 30% compression/elongation can be considered as malleable/ductile. A first diffusion barrier layer 16 and a second diffusion barrier layer 18 are formed on both sides (bottom and top) of the slip layer 17, respectively. The material of the first diffusion barrier layer 16 and the second diffusion barrier layer 18 is nickel, chromium, or cobalt. The mismatch of thermal expansion is accommodated by allowing dislocation and plane slippage in the slip layer 17. To prevent the slip layer 17 from being consumed as a result of diffusion between the slip layer 17 and the adjacent layers, the slip layer 17 shall be protected by two diffusion barrier layers on top and bottom. Such that a first diffusion barrier layer 16 and a second diffusion barrier layer 18 are formed on both sides (bottom and top) of the slip layer 17, respectively. The slip layer 17 is sandwiched by the first diffusion barrier layer 16 and a second diffusion barrier layer 18. The material of the first diffusion barrier layer 16 and the second diffusion barrier layer 18 is nickel, chromium, or cobalt because of their effectiveness in impeding diffusion.

Figure 3:
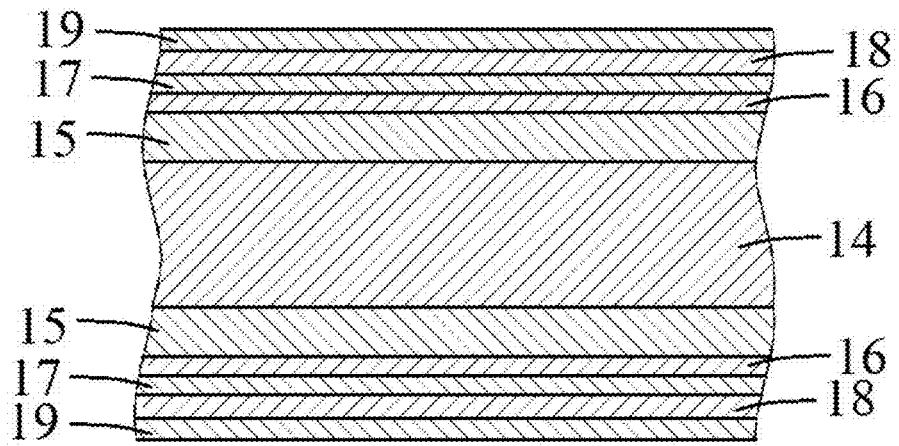
FIG. 3 is a schematic cross-section view of a cross section of the slip layer substrate of the present invention.

With reference to FIG. 3, this illustrates a schematic cross-section view of a cross section of the slip layer substrate of the present invention. The slip layer substrate is substantially consisted of a base material 14, a first metallization layer 15, a first diffusion barrier layer 16, a slip layer 17, a second diffusion barrier layer 18, and a second metallization layer 19. The first metallization layer 15 is formed on the base material 14; the first diffusion barrier layer 16 is formed on the first metallization layer 15; the slip layer 17 is formed on the first diffusion barrier layer 16; the second diffusion barrier layer 18 is formed on the slip layer 17 and the second metallization layer 19 is formed on the second diffusion barrier layer 18. The base material 14 is ceramic, metal based material, or non-metal based material. The material of the first metallization layer 15 is copper, aluminum, or any conductive pure metal or conductive alloy that can establish electrical connection purpose and the material of the first diffusion barrier layer 16 and the second diffusion barrier layer 18 is nickel, chromium, or cobalt. The first diffusion barrier layer 16 and the second diffusion barrier layer 18 prevent diffusion between the first metallization layer 15 and the slip layer 17. The material of the second metallization layer 19 is gold, silver, aluminum or copper.

Unlike the gold plating layer 13 in the conventional multilayer metallized substrate, which will be consumed during soldering process, the slip layer 17 of the present invention is protected by the two diffusion barrier layers 16 and 18 because of the impeded diffusion across the two diffusion barrier layers 16 and 18. The excellent malleability and ductility of the slip layer 17 is utilized to accommodate thermal expansion mismatch thus reduces the thermal stress being transferred from the CTE non-matching heat spreading layer to the substrate base material and the electronic device attached to the second metallization layer 19.

Moreover, the first diffusion barrier layer 16 is formed on the first metallization layer 15; the second diffusion barrier layer 18 is formed on the slip layer 17; the slip layer 17 is formed on the first diffusion barrier layer 16; and the second metallization layer 19 is formed on the second diffusion barrier layer 18.

Figure 4:
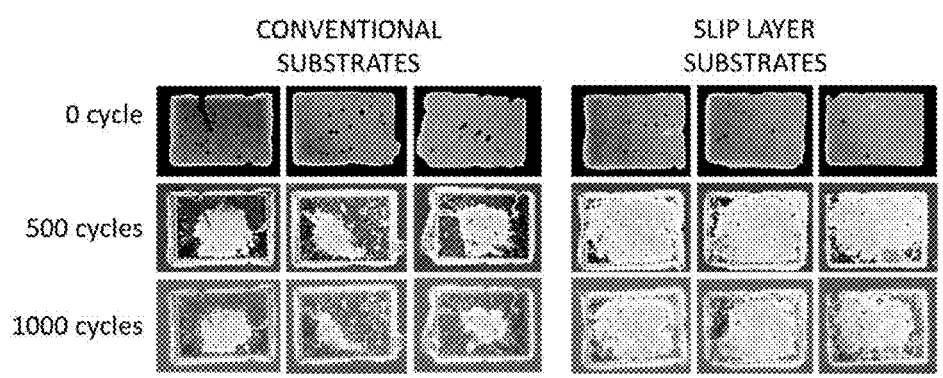
FIG. 4 is sonoscan images of solder joints after 500 and 1000 temperature cycles of multilayer metallized substrate and the slip layer substrate of the present invention.

With reference to FIG. 4, this illustrates sonoscan images of solder joints after 500 and 1000 temperature cycles of conventional DBC substrate and the slip layer substrate of the present invention. A comparison of reliability is made on the slip layer substrate of the present invention and the conventional DBC substrate. Both the slip layer substrates of the present invention and the conventional DBC substrates are soldered onto the same copper heat spreader plate. Temperature cycling tests are then performed on the soldered substrates with temperature range from −50° C. to 150° C. As shown in the sonoscan images in FIG. 4, after 1000 temperature cycles, the slip layer substrates of the present invention show cumulated voiding of less than 30% of the attachment area, while the conventional DBC substrates show more than 60% delamination. This comparison clearly shows that the slip layer substrate of the present invention significantly delays the onset of the complete delamination of a metallized substrate hence improving structural reliability and thermal performance over the life of products.

Figure 5:
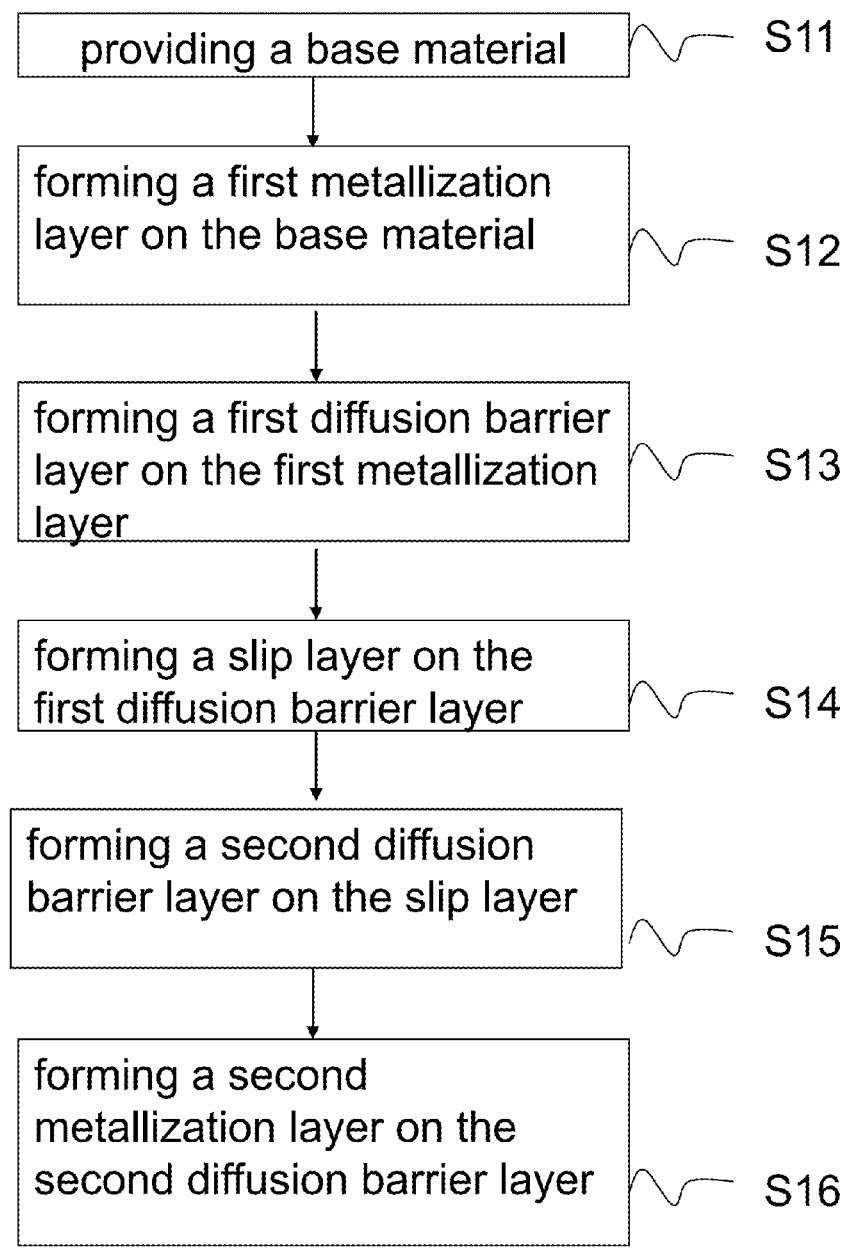
FIG. 5 is a flow chart of manufacturing the slip layer substrate of the present invention.

With reference to FIG. 5, this illustrates a flow chart of manufacturing the slip layer substrate of the present invention. The manufacturing flow comprises the following steps: providing a base material (step S11); forming a first metallization layer on the base material (step S12); forming a first diffusion barrier layer on the first metallization layer (step S13); forming a slip layer on the first diffusion barrier layer (step S14); forming a second diffusion barrier layer on the slip layer (step S15); and forming a second metallization layer on the second diffusion barrier layer (step S16). The base material can be ceramic, metal based material, or non-metal based material. The material of the first metallization layer is copper, aluminum, or any conductive pure metal or conductive alloy that can establish an electrical connection, and the material of the first diffusion barrier layer and the second diffusion barrier layer is nickel, chromium, or cobalt. The first diffusion barrier layer and the second diffusion barrier layer prevent diffusion between the first metallization layer and the slip layer. The slip layer is made of malleable and ductile materials, such as pure metals like gold, silver, aluminum or copper etc. and some malleable metal alloys and non-metals. The material of the second metallization layer is gold, silver, aluminum or copper.

Moreover, the first diffusion barrier layer is formed on the first metallization layer; the second diffusion barrier layer is formed on the slip layer; the slip layer is formed on the first diffusion barrier layer; and the second metallization layer is formed on the second diffusion barrier layer.

Although the present invention has been described in terms of specific exemplary embodiments and examples, it will be appreciated that the embodiments disclosed herein are for illustrative purposes only and various modifications and alterations might be made by those skilled in the art without departing from the spirit and scope of the invention as set forth in the following claims.

What is claimed is:

1. A slip layer substrate, comprising:
    a base material;
    a first metallization layer formed on the base material;
    a first diffusion barrier layer formed on the first metallization layer that the first metallization layer is sandwiched between the base material and the first diffusion barrier layer;
    a slip layer formed on the first diffusion barrier layer that the first diffusion barrier layer is sandwiched between the slip layer and the first metallization layer, wherein the slip layer is made of malleable and ductile material and has a low mechanical strength;
    a second diffusion barrier layer formed on the slip layer that the slip layer is sandwiched between the second diffusion barrier layer and the first diffusion barrier layer, wherein the first diffusion barrier layer and the second diffusion barrier layer are made of cobalt; and
    a second metallization layer formed on the second diffusion barrier layer that the second diffusion barrier layer is sandwiched between the second metallization layer and the slip layer.

2. The slip layer substrate according to claim 1, wherein the base material is selected from the group consisting of ceramic, metal based material, and non-metal based material.

3. The slip layer substrate according to claim 1, wherein the material of the first metallization layer is selected from the group consisting of copper, aluminum, conductive pure metal, and conductive alloy that is able to establish electrical connection purpose.

4. The slip layer substrate according to claim 1, wherein the slip layer is made of material which is selected from the group consisting of gold, silver, aluminum, copper, malleable metal alloys and non-metals.

5. The slip layer substrate according to claim 1, wherein the first diffusion barrier layer is formed on the first metallization layer; the second diffusion barrier layer is formed on the slip layer; the slip layer is formed on the first diffusion barrier layer; and the second metallization layer is formed on the second diffusion barrier layer.

6. The slip layer substrate according to claim 1, wherein the material of the second metallization layer is selected from the group consisting of gold, silver, aluminum and copper.

7. A method for manufacturing slip layer substrate, comprising:
    providing a base material;
    forming a first metallization layer on the base material;
    forming a first diffusion barrier layer on the first metallization layer that the first metallization layer is sandwiched between the base material and the first diffusion barrier layer;
    forming a slip layer on the first diffusion barrier layer that the first diffusion barrier layer is sandwiched between the slip layer and the first metallization layer, wherein the slip layer is made of malleable and ductile material and has a low mechanical strength;

forming a second diffusion barrier layer on the slip layer that the slip layer is sandwiched between the second diffusion barrier layer and the first diffusion barrier layer, wherein the first diffusion barrier layer and the second diffusion barrier layer are made of cobalt; and forming a second metallization layer on the second diffusion barrier layer that the second diffusion barrier layer is sandwiched between the second metallization layer and the slip layer.

8. The method for manufacturing slip layer substrate according to claim 7, wherein the base material is selected from the group consisting of ceramic, metal based material, and non-metal based material.

9. The method for manufacturing slip layer substrate according to claim 7, wherein the material of the first metallization layer is selected from the group consisting of copper, aluminum, conductive pure metal, and conductive alloy that is able to establish electrical connection purpose.

10. The method for manufacturing slip layer substrate according to claim 7, wherein the slip layer is made of material which is selected from the group consisting of gold, silver, aluminum, copper, malleable metal alloys and non-metals.

11. The method for manufacturing slip layer substrate according to claim 7, wherein the first diffusion barrier layer is formed on the first metallization layer; the second diffusion barrier layer is formed on the slip layer; the slip layer is formed on the first diffusion barrier layer; and the second metallization layer is formed on the second diffusion barrier layer.

12. The method for manufacturing slip layer substrate according to claim 7, wherein the material of the second metallization layer is selected from the group consisting of gold, silver, aluminum and copper.

13. A slip layer substrate, comprising:
a base material;
two first metallization layers formed on two opposite sides of the base material respectively that the base material is sandwiched between the first metallization layers;

two first diffusion barrier layers formed on the two first metallization layers respectively that the base material is located between the two first diffusion barrier layers;

two slip layers formed on the two first diffusion barrier layers respectively that the base material is located between the two slip layers, wherein each of the slip layers is made of malleable and ductile material and has a low mechanical strength;

two second diffusion barrier layers formed on the two slip layers respectively that the base material is located between the two second diffusion barrier layers, each of the first diffusion barrier layers and the second diffusion barrier layers is made of material having a high mechanical strength; and two second metallization layers formed on the two second diffusion barrier layers respectively that the base material is located between the two second metallization layers.

14. The slip layer substrate according to claim 13, wherein each of the slip layers is made of material selected from the group consisting of gold, silver, aluminum, copper, malleable metal alloys and non-metals.

15. The slip layer substrate according to claim 13, wherein the base material is selected from the group consisting of ceramic, metal based material, and non-metal based material.

16. The slip layer substrate according to claim 13, wherein each of the first metallization layers is made of material selected from the group consisting of copper, aluminum, conductive pure metal, and conductive alloy that is able to establish electrical connection purpose.

17. The slip layer substrate according to claim 13, wherein each of the first diffusion barrier layers and the second diffusion barrier layers is made of cobalt.

18. The slip layer substrate according to claim 13, wherein each of the second metallization layers is made of material selected from the group consisting of gold, silver, aluminum and copper.

* * * * *